United States Patent
Sankaranarayanan et al.

(10) Patent No.: US 9,728,236 B1
(45) Date of Patent: Aug. 8, 2017

(54) SYSTEM AND METHOD OF TRAINING OPTIMIZATION FOR DUAL CHANNEL MEMORY MODULES

(71) Applicant: DELL PRODUCTS, LP, Round Rock, TX (US)

(72) Inventors: Vadhiraj Sankaranarayanan, Austin, TX (US); Bhyrav M. Mutnury, Round Rock, TX (US); Stuart Allen Berke, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 15/331,064

(22) Filed: Oct. 21, 2016

(51) Int. Cl.
*G11C 8/00* (2006.01)
*G11C 7/10* (2006.01)

(52) U.S. Cl.
CPC .......... *G11C 7/1075* (2013.01); *G11C 7/1006* (2013.01); *G11C 7/1072* (2013.01)

(58) Field of Classification Search
CPC ... G11C 7/1045; G11C 7/1072; G11C 7/1075; G11C 8/16
See application file for complete search history.

(56) References Cited

U.S. PATENT DOCUMENTS

| | | | | |
|---|---|---|---|---|
| 6,151,256 A | * | 11/2000 | Maesako | G11C 7/103 365/189.03 |
| 6,337,832 B1 | * | 1/2002 | Ooishi | G11C 7/1072 365/219 |
| 7,603,498 B2 | | 10/2009 | Bishnoi et al. | |
| 2003/0026161 A1 | * | 2/2003 | Yamaguchi | G11C 7/1006 365/230.03 |
| 2010/0082967 A1 | | 4/2010 | Lo | |
| 2012/0137040 A1 | * | 5/2012 | Kim | G11C 5/063 710/308 |
| 2013/0021866 A1 | * | 1/2013 | Lee | H01L 25/0657 365/230.01 |
| 2014/0192583 A1 | * | 7/2014 | Rajan | G11C 7/10 365/63 |
| 2015/0078104 A1 | | 3/2015 | Brandl et al. | |
| 2017/0076797 A1 | * | 3/2017 | Lung | G11C 13/0097 |

* cited by examiner

*Primary Examiner* — Tuan T Nguyen
(74) *Attorney, Agent, or Firm* — Larson Newman, LLP

(57) ABSTRACT

A memory channel includes a dual channel double data rate (DDR) memory device having a first bank of memory accessed by a first data bus and a first command/address (C/A) bus, and a second bank of memory accessed by a second data bus and a second C/A bus, and a memory controller configured to train the first and second C/A busses with both the first and second C/A busses active, and to train one of the first and second C/A busses with the other of the first and second C/A busses idle.

20 Claims, 3 Drawing Sheets

SYSTEM AND METHOD OF TRAINING OPTIMIZATION FOR DUAL CHANNEL MEMORY MODULES

FIELD OF THE DISCLOSURE

This disclosure generally relates to information handling systems, and more particularly relates to training optimization for dual channel memory modules in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

SUMMARY

A memory channel can include a dual channel double data rate (DDR) memory device and a memory controller. The dual channel DDR memory device can include a first bank of memory accessed by a first data bus and a first command/address (C/A) bus, and a second bank of memory accessed by a second data bus and a second C/A bus. The memory controller can be configured to train the first and second C/A busses with both the first and second C/A busses active, and to train one of the first and second C/A busses with the other of the first and second C/A busses idle. The memory controller can be further configured to train the first and second data busses for write transactions with both first and second data busses configured to write data, and to train one of the first and second data busses for write transactions with the other of the first and second data busses configured to read data. The memory controller can be further configured to train one of the first and second data busses for write transactions with the other of the first and second data busses idle. The memory controller can be further configured to train the first and second data busses for read transactions with both first and second data busses configured to read data, and to train one of the first and second data busses for read transactions with the other of the first and second data busses configured to write data. The memory controller can be further configured to train one of the first and second data busses for read transactions with the other of the first and second data busses idle.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
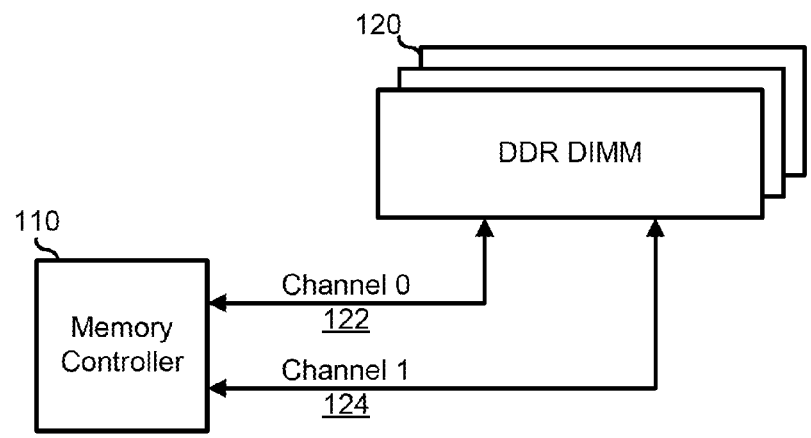
FIG. 1 is a block diagram of a dual channel double data rate (DDR) dual in-line memory module (DIMM) memory channel according to an embodiment of the present disclosure.

FIG. 1 illustrates a memory channel 100 for an information handling system. For the purpose of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

Figure 2:
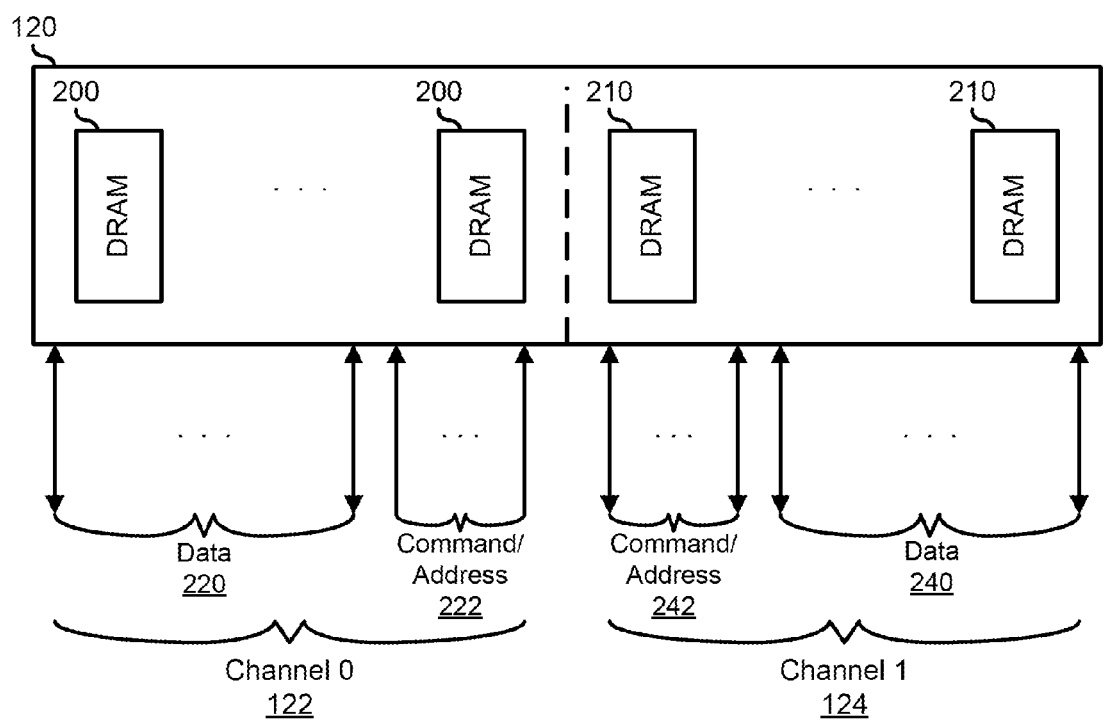
FIG. 2 is a block diagram of a dual channel DDR DIMM of FIG. 1.

Memory channel 100 includes a memory controller 110 and one or more dual channel—double data rate (DDR) dual in-line memory modules (DIMMs) 120. Dual channel DDR DIMMs 120 represent a memory device technology that includes two separate memory channels, channel 0 122, and channel 1 124. FIG. 2 illustrates a typical dual channel DDR DIMM 120 that is organized into a first set of dynamic random access memory (DRAM) 200 and a second set of DRAM 210. Here, channel 0 122 is associated with DRAM 200 and channel 1 124 is associated with DRAM 210. As such, channel 0 122 includes a channel 0 data bus 220 that represents half of the data lines to dual channel DDR DIMM 100, and a command/address (C/A) bus 222 for controlling data transactions with DRAM 200. Similarly, channel 1 124 includes a channel 1 data bus 240 that represents the other half of the data lines to dual channel DDR DIMM 100, and a C/A 242 for controlling data transactions with DRAM 210. In particular, where dual channel DDR DIMM 100 is a 64-bit memory device, channel 0 122, data bus 220 represents a lower 32-bits of data stored on DRAM 200 and data bus 240 represents a higher 32-bits of data stored on DRAM 210. It will be understood that data busses 220 and 240 can include error correcting code (ECC) bits as needed or desired, and that each data bus may therefore represent, for example, 36-bits of data; 32-bits of data and 4-bits of ECC data. Note that other data bus arrangements may be utilized, as needed or desired, such as where a DRAM includes 8-bits of ECC data, another number of bits of ECC data, or no ECC data bits.

Each of DRAM banks 200 and 210 are separately accessible for data transactions with memory controller 100. In particular, memory controller 110 can issue memory reads simultaneously to both of DRAM banks 200 and 210, can issue memory writes to both DRAM banks, can issue a memory read to a one DRAM bank while simultaneously issuing a memory write to the other DRAM bank, can issue a memory read to one DRAM bank while the other DRAM bank is idle, or can issue a memory write to one DRAM bank while the other DRAM bank is idle. As such, while the data lines are split into two data busses 220 and 240 that are each 32-bits wide, each of DRAM banks 200 and 210 needs its own associated C/A bus 222 and 242, respectively, to control the data transactions with the associated DRAM banks. As such, memory channel 100 represents a memory channel for a DDR memory standard beyond the present DDR synchronous dynamic random access memory (SDRAM) standards, such as the Joint Electron Device Engineering Council (JEDEC) DDR-200 standard, DDR-266 standard, the DDR-333 standard, or the DDR-400A/B/C standard. In particular, memory channel 100 represents a fifth or greater generation DDR memory channel, such as a DDR memory channel in accordance with a future DDR5 standard, or beyond.

Memory controller 110 operates to train channels 122 and 124 when the devices associated with memory channel 100 are powered on. However, training of memory channel 100 represents challenges to the maintenance of high signal integrity beyond those faced by single channel memory devices. This is because, in training single channel memory devices, a simple process of training all C/A lines together, training all data lines together for write operations, and training all data lines together for read operations, is insufficient to train for the cross-talk and noise effects for all of the data transaction modes associated with dual channel DDR DIMM 120. In particular, merely training C/A busses 222 and 242 together fails to adequately cover the training needs for cases where one C/A bus is active and the other C/A bus is idle. Also, performing write side training on both data busses 220 and 240 fails to adequately cover the training needs for cases where one data bus is performing a data write and the other data bus is performing a data read or is idle. Similarly, performing read side training on both data busses 220 and 240 fails to adequately cover the training needs for cases where one data bus is performing a data read and the other data bus is performing a data write or is idle.

As such, memory controller 110 operates to train channels 122 and 124 in the various transaction modes. In particular, memory controller 110 initiates a training mode for training C/A busses 222 and 242, whereby the C/A busses are trained with both busses active, referred to as C/A active-active training, then with each C/A bus active while the other C/A bus is idle, referred to as C/A active-idle training. Memory controller 110 further initiates another training mode for write training of data busses 220 and 240, whereby the data busses are trained with both data busses performing write data transactions, referred to as data write-write training, with each data bus performing a write data transaction while the other data bus is performing a read data transaction, referred to as data write-read training, and with each data bus performing a write data transaction while the other data bus is idle, referred to as data write-idle training. Finally, memory controller 110 initiates another training mode for read training of data busses 220 and 240, whereby the data busses are trained with both data busses performing read data transactions, referred to as data read-read training, with each data bus performing a read data transaction while the other data bus is performing a write data transaction, referred to as data read-write training, and with each data bus performing a read data transaction while the other data bus is idle, referred to as data read-idle training.

Note that the order in which memory controller 110 initiates the training modes, and the order in which the memory controller performs the individual trainings within the training modes, may be different from the order as described herein, as needed or desired. Further note that for each training mode, memory controller 110 may derive separate training parameters for each training performed. As such, in a particular embodiment, memory controller 110 further operates to consolidate the write training parameters into a single "best fit" training parameter that takes a numerical average value for each of the parameters generated by a particular trainings, and then applies the best fit parameter to during normal operations. In another embodiment, memory controller 110 operates to consolidated the write training parameters into a "worst case" training parameter by applying the one worst case training parameter in all cases during normal operation. In another embodiment, memory controller 110 operates to recall each training parameter generated by each training, and applies that training parameter when the data transaction mode matches the particular training mode that generated the training parameter. For example, where a particular training parameter is generated during a data read-write training, where data bus 220 is performing a data read transaction and data bus 240 is performing a data write transaction, then, during normal operations, when data bus 220 performs a data read transaction simultaneously with data bus 240 performing a data write transaction, then memory controller 110 can operate to provide that particular training parameter to the transaction.

The C/A training can include C/A signal alignment with a clock signal, and an associated C/A training parameter can include a delay pre-set for sending C/A signals on the C/A busses. The write training can include write leveling to align a data strobe (DQS) on the data busses with a the clock signal, and write training to align the data strobe DQS with the write data signals on the data busses. As such, the associated write training parameters can include a delay pre-set for sending the data strobe DQS on the data busses and a delay pre-set for sending the data on the data busses. The read training can include read leveling to align the memory controller with the data read preamble, and read training to align the DQS on with the read data signals on the data busses. As such, the associated read training parameters can include a delay pre-set for the read data preamble and a delay pre-set for receiving the read data on the data busses.

Figure 3:
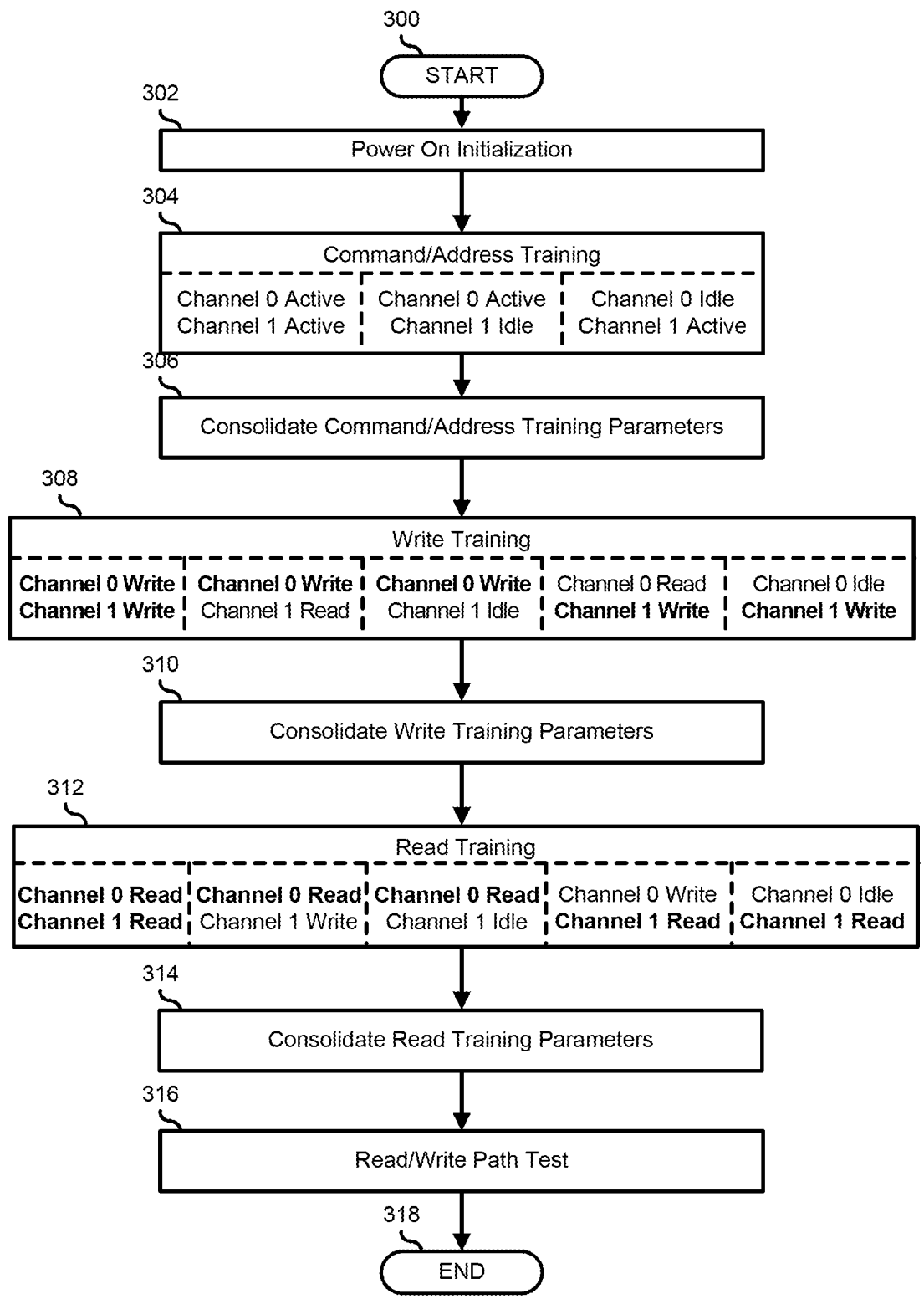
FIG. 3 is a flowchart illustrating a method of training optimization for dual channel DDR DIMMs according to an embodiment of the present disclosure.

FIG. 3 illustrates a method of training optimization for dual channel DDR DIMMs starting at block 300. A memory channel is powered on and initialized in block 302. For example, the devices that make up memory channel 100 can be powered on, and the memory channel can be initialized according, for example, to a JEDEC power-on specification for the memory channel. The memory controller of the memory channel initiates C/A training in block 304. The C/A training includes C/A active-active training with both C/A busses of the dual channel DDR DIMM active, C/A active-idle training with the channel 0 C/A bus active and the channel 1 C/A bus idle, and C/A active-idle training with the channel 1 C/A bus active and the channel 0 C/A bus idle. The C/A training parameters are consolidated into a single training parameter for use in normal operations in block 306. For example, memory controller 110 can utilize a best fit training parameter, a worst case training parameter, or a combination of best fit and worst case training parameters as needed or desired.

The memory controller initiates write training in block 308. The write training includes write-write training with both data busses performing write transactions, write-read training with the channel 0 data bus performing a data write transaction while the channel 1 data bus performs a data read transaction, write-idle training with the channel 0 data bus performing a data write transaction while the channel 1 data bus is idle, write-read training with the channel 1 data bus performing a data write transaction while the channel 0 data bus performs a data read transaction, and write-idle training with the channel 1 data bus performing a data write transaction while the channel 0 data bus is idle. The write training parameters are consolidated into a single training parameter for use in normal operations in block 310. Again, memory controller 110 can utilize a best fit training parameter, a worst case training parameter, or a combination of best fit and worst case training parameters as needed or desired.

The memory controller initiates read training in block 312. The read training includes read-read training with both data busses performing read transactions, read-write training with the channel 0 data bus performing a data read transaction while the channel 1 data bus performs a data write transaction, read-idle training with the channel 0 data bus performing a data read transaction while the channel 1 data bus is idle, read-write training with the channel 1 data bus performing a data read transaction while the channel 0 data bus performs a data write transaction, and read-idle training with the channel 1 data bus performing a data read transaction while the channel 0 data bus is idle. The read training parameters are consolidated into a single training parameter for use in normal operations in block 310. Again, memory controller 110 can utilize a best fit training parameter, a worst case training parameter, or a combination of best fit and worst case training parameters as needed or desired. Read and write path testing is performed by the memory controller to further refine of calibrate the memory channel, as needed or desired, in block 316, and the method ends in block 318. Note that the method as shown in FIG. 3 is repeated for each dual channel DDR DIMM in a memory channel.

Figure 4:
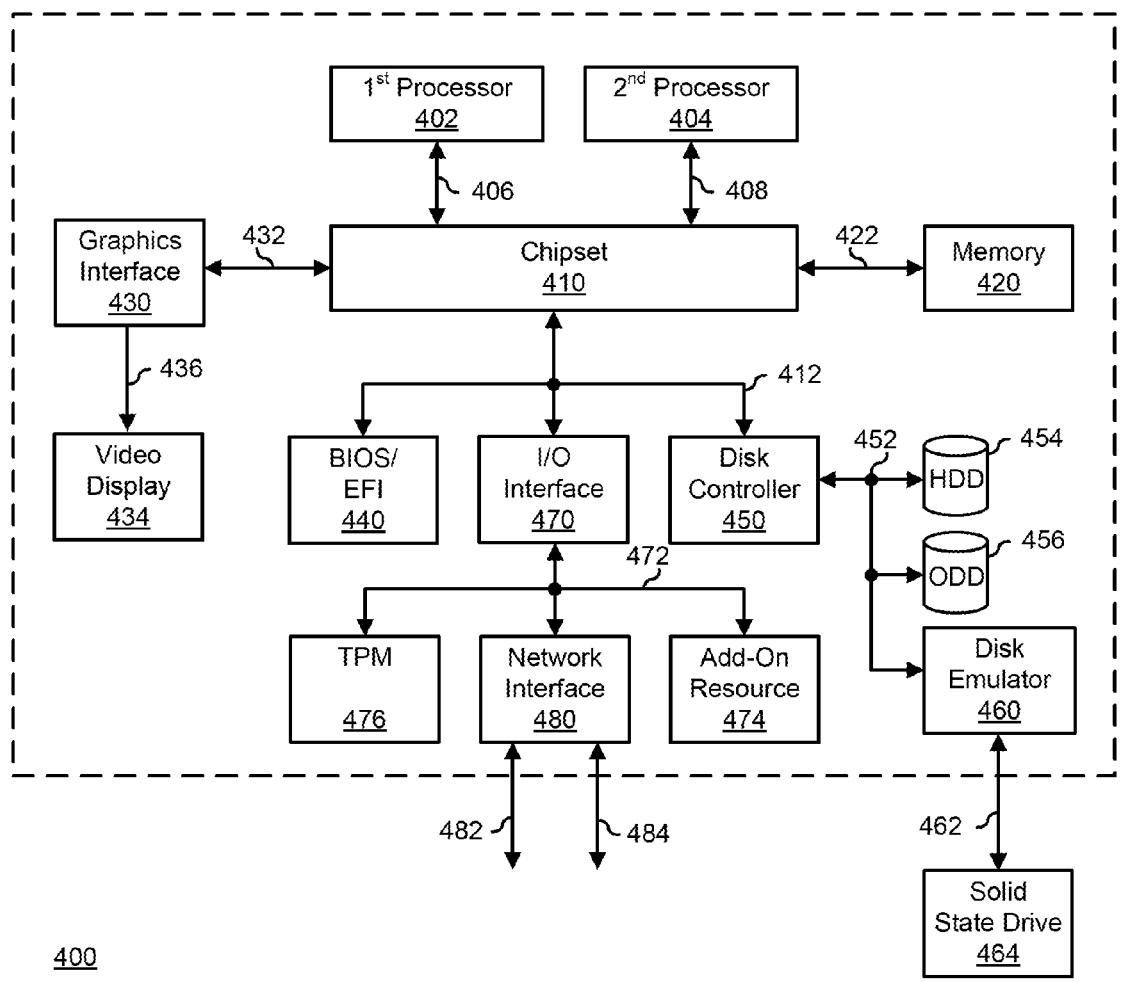
FIG. 4 is a block diagram illustrating a generalized information handling system according to an embodiment of the present disclosure.

In a particular embodiment, a DDR DIMM is configured that include more than two memory channels. Here, channel training for the DDR DIMM will include multiple write and read training modes, as needed or desired. For example, where a DDR DIMM includes three memory channels, the write training can include a write-write-write mode, a write-write-read mode, a write-write-idle mode, a write-read-write mode, a write-read-read mode, a write-read-idle mode, a write-idle-write mode, a write-idle-read mode, a write-idle-idle mode, and so on, to cover all possible combinations of write training modes. The DDR DIMM can also include all possible combinations of read training modes FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory channel comprising:
   a dual channel double data rate (DDR) memory device including a first bank of memory and a second bank of memory, the first memory bank being accessed by a first data bus and a first command/address (C/A) bus, and the second bank of memory being accessed by a second data bus and a second C/A bus; and
   a memory controller configured to:
      train the first and second C/A busses with both the first and second C/A busses active; and
      train one of the first and second C/A busses with the other of the first and second C/A busses idle.

2. The memory channel of claim 1, wherein the memory controller is further configured to:
   determine a first C/A training parameter based on the training of the first and second C/A busses with both the first and second C/A busses active;
   determine a second C/A training parameter based on the training of the one of the first and second C/A busses with the other of the first and second C/A busses idle; and
   select one of the first and second C/A training parameters for use on the memory channel during memory transactions.

3. The memory channel of claim 1, wherein the memory controller is further configured to:
   train the first and second data busses for write transactions with both first and second data busses configured to write data; and
   train one of the first and second data busses for write transactions with the other of the first and second data busses configured to read data.

4. The memory channel of claim 3, wherein the memory controller is further configured to:

determine a first data write training parameter based on the training of the first and second data busses for write transactions with both first and second data busses configured to write data;

determine a second data write training parameter based on the training of the one of the first and second data busses for write transactions with the other of the first and second data busses configured to read data; and select one of the first and second data write training parameters for use on the memory channel during memory transactions.

5. The memory channel of claim 3, wherein the memory controller is further configured to:

train one of the first and second data busses for write transactions with the other of the first and second data busses idle.

6. The memory channel of claim 3, wherein the memory controller is further configured to:

train the first and second data busses for read transactions with both first and second data busses configured to read data; and train one of the first and second data busses for read transactions with the other of the first and second data busses configured to write data.

7. The memory channel of claim 6, wherein the memory controller is further configured to:

determine a first data read training parameter based on the training of the first and second data busses for read transactions with both first and second data busses configured to read data;

determine a second data read training parameter based on the training of the one of the first and second data busses for read transactions with the other of the first and second data busses configured to write data; and select one of the first and second data read training parameters for use on the memory channel during memory transactions.

8. The memory channel of claim 6, wherein the memory controller is further configured to:

train one of the first and second data busses for read transactions with the other of the first and second data busses idle.

9. A method comprising:

training, by a memory controller of a memory channel, a first command/address (C/A) bus and a second C/A bus of a dual channel double data rate (DDR) memory device of the memory channel with both the first and second C/A busses active, the first C/A bus to access a first bank of memory of the dual channel DDR memory device and the second C/A bus to access a second bank of memory of the dual channel DDR memory device; and training, by the memory controller, one of the first and second C/A busses with the other of the first and second C/A busses idle.

10. The method of claim 9, further comprising:

determining, by the memory controller, a first C/A training parameter based on the training of the first and second C/A busses with both the first and second C/A busses active;

determining, by the memory controller, a second C/A training parameter based on the training of the one of the first and second C/A busses with the other of the first and second C/A busses idle; and selecting one of the first and second C/A training parameters for use on the memory channel during memory transactions.

11. The method of claim 9, further comprising:

training, by the memory controller, a first data bus of the dual channel DDR memory device and a second data bus of the dual channel DDR memory device for write transactions with both first and second data busses configured to write data, the first data bus to access the first bank of memory and the second data bus to access the second bank of memory; and training, by the memory controller, one of the first and second data busses for write transactions with the other of the first and second data busses configured to read data.

12. The method of claim 11, further comprising:

determining, by the memory controller, a first data write training parameter based on the training of the first and second data busses for write transactions with both first and second data busses configured to write data;

determining, by the memory controller, a second data write training parameter based on the training of the one of the first and second data busses for write transactions with the other of the first and second data busses configured to read data; and selecting one of the first and second data write training parameters for use on the memory channel during memory transactions.

13. The method of claim 11, further comprising:

training, by the memory controller, one of the first and second data busses for write transactions with the other of the first and second data busses idle.

14. The method of claim 11, further comprising:

training, by the memory controller, the first and second data busses for read transactions with both first and second data busses configured to read data; and training, by the memory controller, one of the first and second data busses for read transactions with the other of the first and second data busses configured to write data.

15. The method of claim 14, further comprising:

determining, by the memory controller, a first data read training parameter based on the training of the first and second data busses for read transactions with both first and second data busses configured to read data;

determine, by the memory controller, a second data read training parameter based on the training of the one of the first and second data busses for read transactions with the other of the first and second data busses configured to write data; and selecting one of the first and second data read training parameters for use on the memory channel during memory transactions.

16. The method of claim 14, further comprising:

training, by the memory controller, one of the first and second data busses for read transactions with the other of the first and second data busses idle.

17. A non-transitory computer-readable medium including code for performing a method, the method comprising:

training a first command/address (C/A) bus and a second C/A bus of a dual channel double data rate (DDR) memory device of a memory channel with both the first and second C/A busses active, the first C/A bus to access a first bank of memory of the dual channel DDR memory device and the second C/A bus to access a second bank of memory of the dual channel DDR memory device; and training one of the first and second C/A busses with the other of the first and second C/A busses idle.

18. The computer-readable medium of claim 17, the method further comprising:
- training, by a memory controller of the memory channel, a first data bus of the dual channel DDR memory device and a second data bus of the dual channel DDR memory device for write transactions with both first and second data busses configured to write data, the first data bus to access the first bank of memory and the second data bus to access the second bank of memory; and
- training, by the memory controller, one of the first and second data busses for write transactions with the other of the first and second data busses configured to read data.

19. The computer-readable medium of claim 18, the method further comprising:
- training, by the memory controller, one of the first and second data busses for write transactions with the other of the first and second data busses idle.

20. The computer-readable medium of claim 18, the method further comprising:
- training, by the memory controller, the first and second data busses for read transactions with both first and second data busses configured to read data;
- training, by the memory controller, one of the first and second data busses for read transactions with the other of the first and second data busses configured to write data; and
- training, by the memory controller, one of the first and second data busses for read transactions with the other of the first and second data busses idle.

* * * * *